(12) United States Patent
Dijkhuis et al.

(10) Patent No.: US 7,944,658 B2
(45) Date of Patent: May 17, 2011

(54) INTEGRATED CIRCUIT AND ASSEMBLY THEREWITH

(75) Inventors: Johannes F. Dijkhuis, Nijmegen (NL); Antonius J. M. De Graauw, Haelen (NL)

(73) Assignee: NXP B.V., Eindhoven (NL)

( * ) Notice: Subject to any disclaimer, the term of this patent is extended or adjusted under 35 U.S.C. 154(b) by 67 days.

(21) Appl. No.: 12/305,686

(22) PCT Filed: Jun. 15, 2007

(86) PCT No.: PCT/IB2007/052289
§ 371 (c)(1), (2), (4) Date: Dec. 19, 2008

(87) PCT Pub. No.: WO2008/007257
PCT Pub. Date: Jan. 17, 2008

(65) Prior Publication Data
US 2009/0185317 A1    Jul. 23, 2009

(30) Foreign Application Priority Data
Jun. 20, 2006  (EP) ................................. 06115750

(51) Int. Cl.
*H02H 9/00*    (2006.01)
*H01C 7/12*    (2006.01)
*H02H 1/00*    (2006.01)
*H02H 1/04*    (2006.01)

(52) U.S. Cl. .......................................... 361/56; 361/118
(58) Field of Classification Search ...................... 361/56
See application file for complete search history.

(56) References Cited

U.S. PATENT DOCUMENTS

| 5,801,065 A | 9/1998 | Rizvi et al. |
| 6,433,985 B1 | 8/2002 | Voldman et al. |
| 7,430,103 B2 * | 9/2008 | Kato .............................. 361/212 |
| 2006/0098374 A1 * | 5/2006 | Youn .............................. 361/119 |
| 2006/0131691 A1 * | 6/2006 | Roozeboom et al. .......... 257/534 |

FOREIGN PATENT DOCUMENTS

| EP | 063004422.0 | 11/2007 |
| WO | 2001061847 | 8/2001 |
| WO | 200385729 A | 10/2003 |
| WO | 2004114397 A1 | 12/2004 |

* cited by examiner

*Primary Examiner* — Dharti H Patel

(57) ABSTRACT

An integrated circuit suitable for use at high frequencies and comprising a first capacitor having an input and an output, as well as a ground connection, wherein the capacitor is ESD-protected through an resistor between the capacitor output and the ground connection, which resistor has a resistance value that is sufficiently high so as to prevent any substantial influence on RF performance of the ground connection.

6 Claims, 6 Drawing Sheets

INTEGRATED CIRCUIT AND ASSEMBLY THEREWITH

The invention relates to an integrated circuit suitable for use at high frequencies and comprising a first capacitor having an input and an output, as well as a ground connection.

The invention further relates to an assembly therewith, and a method of assembling said integrated circuit with a further component without breakdown due to electrostatic discharge.

Such an integrated circuit is known from WO-A 2004/114397. The known integrated circuit is an integrated passive network comprising a trench capacitor in a semiconductor substrate—hereinafter also called passive IC. A vertical interconnect extends through the substrate. The vertical interconnect is meant particularly as a ground connection. As known in the field of RF design, the provision of a proper ground connection is of ultimate importance for an appropriate operation. The integrated circuit is suitably assembled with one or more electronic devices, such as integrated circuits of active components (usually referred to as ICs) to enable a system-in-a-package. This system-in-a-package with the passive IC is particularly relevant for RF applications, as parasitic impedances of interconnects and passive components cannot be neglected here, and integral design is thus needed to arrange at an adequate performance.

It has turned out that the present passive IC and/or the complete system-in-package are relatively vulnerable to electrostatic discharge pulses that occur during assembly. If active ESD protection elements such as Zener diodes are used, the operation of such active ESD-protection elements is hampered through the high resistivity of the substrate. This resistivity is chosen to optimize the performance of any inductors in the passive IC, but has the disadvantage that crosstalk occurs between active elements such as diodes, unless the active elements are shielded from each other. Moreover, a proper ESD protection requires a conductive path from the ESD-protection elements to the outside of the device. Such a conductive path is usually constituted by a good-conducting region in the substrate. However, such good-conducting region is not easily enabled by the high-resistivity substrate.

It is therefore an object of the invention to provide an improved ESD protection for an integrated circuit of the kind defined in the opening paragraph, and particularly for a passive IC.

This object is achieved therein that the capacitor is ESD-protected through a resistive component between the capacitor output and the ground connection, which resistive component has a resistance value that is sufficiently high so as to prevent any substantial influence on RF performance of the ground connection.

According to this aspect of the invention, the capacitor is ESD-protected through a resistive component between the capacitor output and a ground connection within the passive IC, which resistor has a resistance value that is sufficiently high so as to prevent any substantial influence on the RF grounding. Due to the choice of the resistive component, there is no DC voltage over the resistive component during operation of the passive IC. If needed, an additional capacitor can be connected in series with the resistive component. The term 'capacitor output' is used herein to define the output that is connected to ground after finalization of the assembly.

The use of such resistive ESD protection turns out to work adequately for the ESD protection without reduction of the RF performance. The reduction of the ESD peak is substantial. The reduction of peak voltage is fourfold for a 50V ESD pulse—from 80 to 20 V—, as given in accordance with the Machine Model. The reduction of peak voltage is even much more for a 300 V ESD pulse, as given in accordance with the Human Body Model. Without resistor, peak voltages above 200 V were found, and the peak voltage remained in a time frame of far more than 200 ns. With the resistor, the peak voltage was less than 20 V, and decline started already after 10 ns.

It has been found that this coupling between an internal ground and an external ground has marginal influence on the RF performance of the passive IC. The ground impedance is slightly higher at 900 MHz (1.5 vs 1.1. Ohm impedance value). The coupling between internal and external ground increases with the frequency, and is at 0.9 GHz about −50 dB and at 3.0 GHz less than −30 dB. These are acceptable levels of coupling.

Preferably, the resistive component is a resistor, which has the additional advantage of small size. However, an inductor or capacitor could be used alternatively. It is required that the impedance of the resistive component is lower than the impedance of the circuit—i.e. the capacitor—that is to be protected.

Suitably, the resistance value of the ESD protection is at least ten times as large as the impedance of the connection from the capacitor output to a ground external to the integrated circuit. Such a connection is for instance made with a bond wire. Its impedance has then a value in the order of 6Ω at a frequency of about 2 GHz. The resistance value is then suitably larger than 60Ω, for instance up to 200Ω.

The resistive component—hereinafter also referred to as ESD resistor—should be designed to allow the flow of a peak current following an ESD pulse through it. In case that the ESD resistor is aimed at the prevention of damage of an ESD event during assembly or prior to assembly, the voltages of an ESD pulse and the following current are relatively low, and a resistor in doped polysilicon is adequate, while a resistor of TiWN is one of the available alternatives. If one desires to improve an ESD-protection level from 2 kV to 4 kV, the resistor should be designed for a peak current of 3 A.

This ESD protection is particularly suitable for passive ICs and assemblies as discussed in the figure description of the present application. In such passive ICs for RF power applications, the input of one stage of the power amplifier cannot be decoupled and grounded via the same grounding as that of the output of this stage. The connection to the same grounding would introduce too much coupling between said input and output of the power amplifier. This leads to instabilities in the operation of the power amplifier. In view thereof, a separate grounding of the input or the output of the preceding stage is needed. Most preferably, the separate groundings are coupled to the outputs of the first and third stages of the power amplifier. The ESD resistor is coupled also to the third stage of the power amplifier.

The ESD protection of the present invention is however not limited to the use in the context of the RF power amplifier module, and may be used with benefits for any device comprising ESD-sensitive devices, such as in particular capacitors with a relatively low DC-breakdown voltage, i.e below 100 V, particularly below 50 V. The invention is particularly useful for small high-density capacitors with a relatively large internal impedance, particularly capacitors with a capacitance of 100 pF or less, especially of less than 50 pF.

These and other aspects of the invention will be further elucidated with respect to the figure that are not drawn to scale and are purely diagrammatical, and in which the same reference numerals in different figures refer to identical features, in which.

Figure 1:
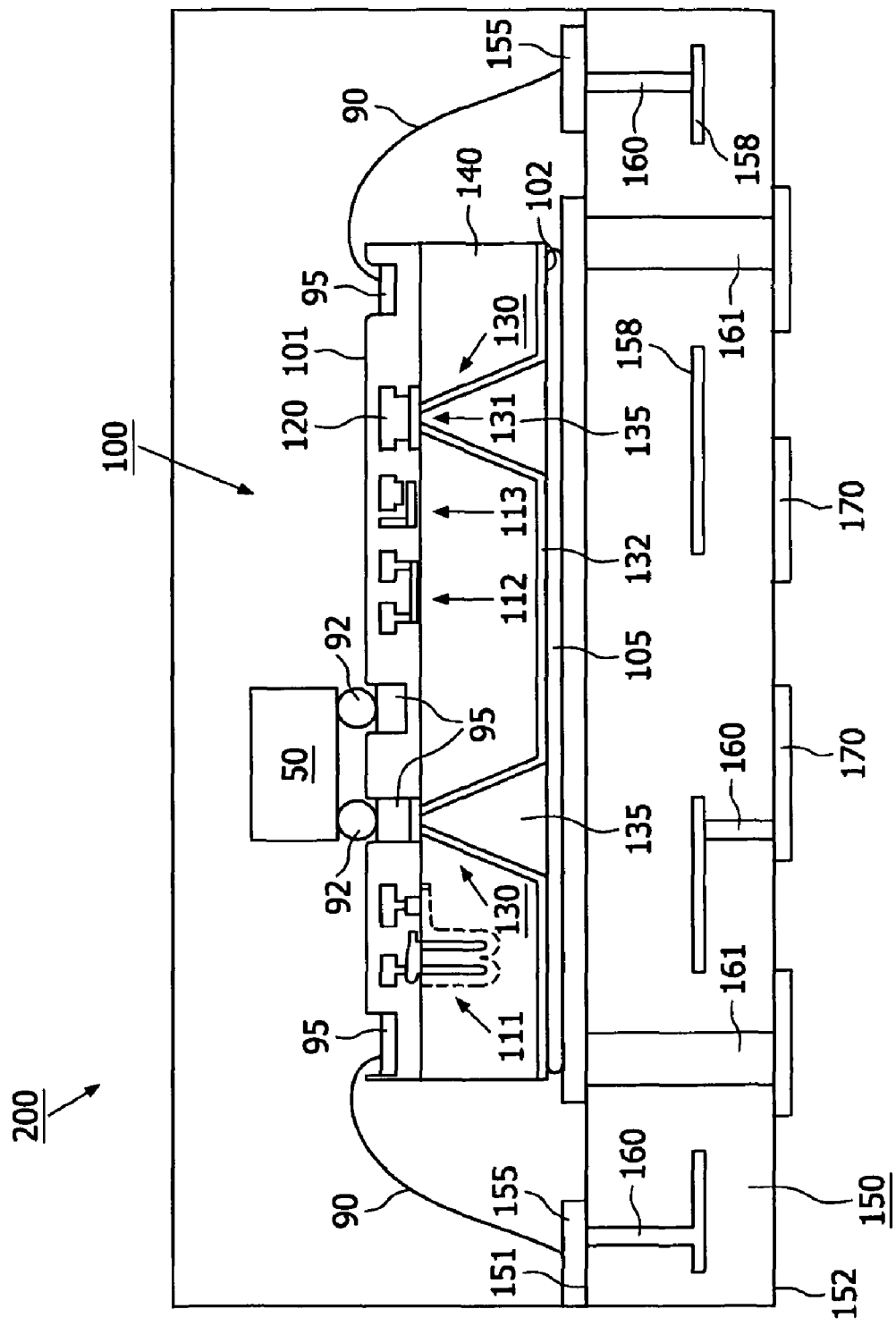
FIG. 1 shows in cross-sectional view the assembly of the invention.

FIG. 1 shows in a cross-sectional view a first embodiment of the assembly 200 with the passive IC 100 of the invention. This passive IC 100 comprises a first side 101 and a second side 102 and is provided with an interconnection substrate 140 of semiconductor material. The substrate 140 comprises vertical interconnects 130 extending from the first side 101 to the second side 102. The passive IC 100 is attached with its second side 102 to a first side 151 of a carrier substrate 150 with an adhesive 105. Bond wires 90 extend from bond pads 95 on the passive IC 100 to corresponding bond pads 155 on the carrier substrate 150. Electrical vertical interconnects 160 extend through the carrier substrate 150 to terminals 170 on a second side 152 of the carrier substrate 150, facing away from the first side 151. Thermal vertical interconnects 161 extend to at least one thermal terminal 171 at the second side. The carrier substrate 150 further contains one or more inductors 158, which are in at least most cases coupled to bond pads 155 on the first side 151.

Passive elements 111-113 have been defined on the first side 101 of the passive IC 100, in addition to interconnects 120 and bond pads 95. Some of those bond pads are provided with bond wires 90 to the carrier substrate 150, while others are provided with solder balls 92 to electrical devices 50 assembled on top of the passive IC 100. It is alternatively possible to provide another connection between any electric device 50 and the passive IC 100, for instance with bond wires, TAB-foil or the like. Examples of electrical devices 50 include a power amplifier, a power control integrated circuit, switches, band pass filters, such as bulk acoustic wave filters, and impedance matching networks, particularly with variable capacitors in the form of MEMS-elements or varactors.

The substrate 140 of a semiconductor material has a resistivity which has been tuned so as to allow definition of high quality inductors on the substrate 140. Particularly, the resistivity has been increased in at least part of the substrate 140, for instance by implantation of dopants such as Ar, Ne, Nitrogen or through irradiation with for instance e-beam. A suitable resistivity is a resistivity of more than 1 kΩ/.

The construction of the passive IC 100 will be discussed in more detail with reference to its manufacture, see FIG. 2-4.

Figure 2:
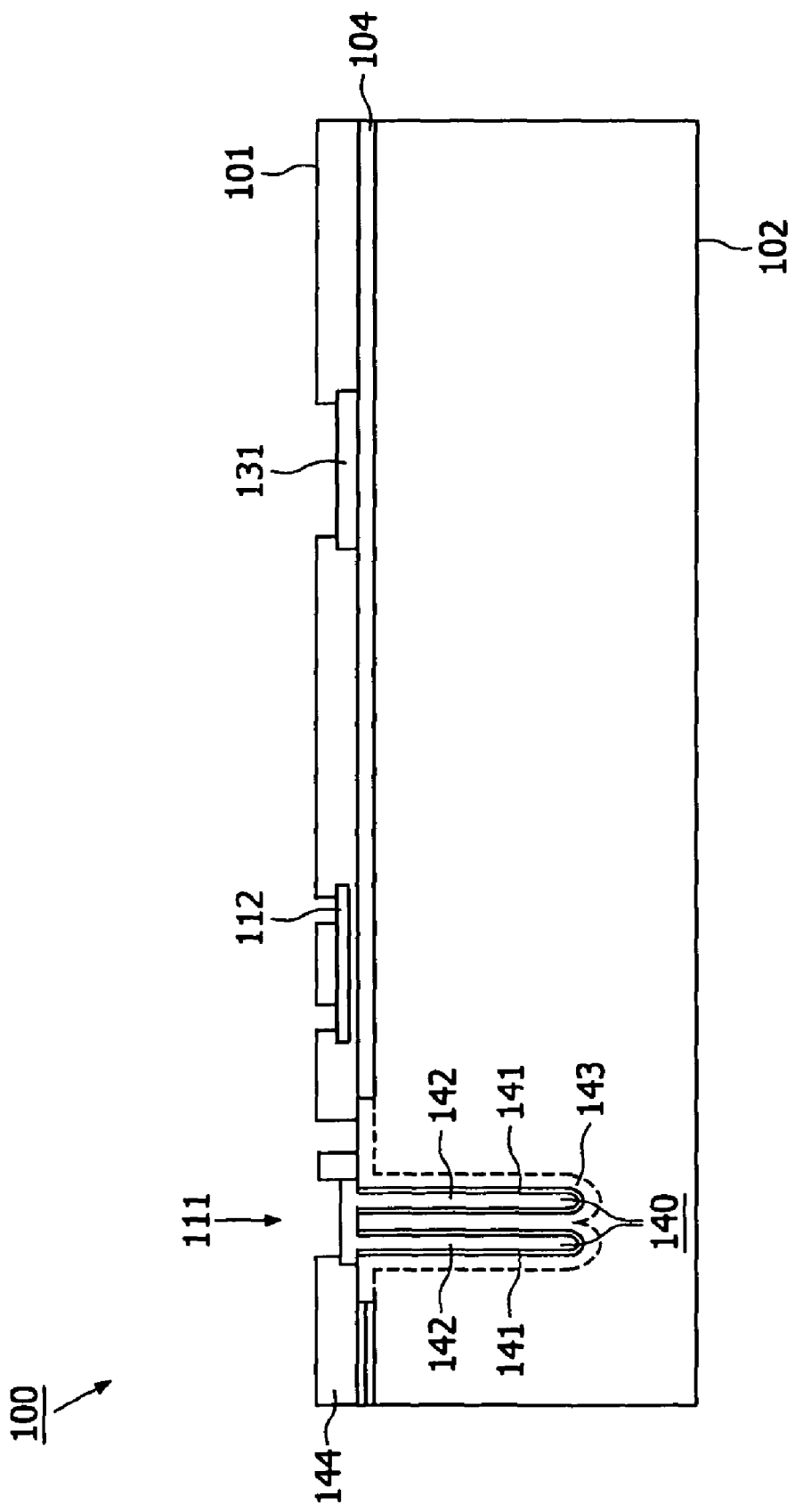
FIGS. 2-4 show in cross-sectional view several stages in the manufacture of the passive IC used therein.
Figure 3:
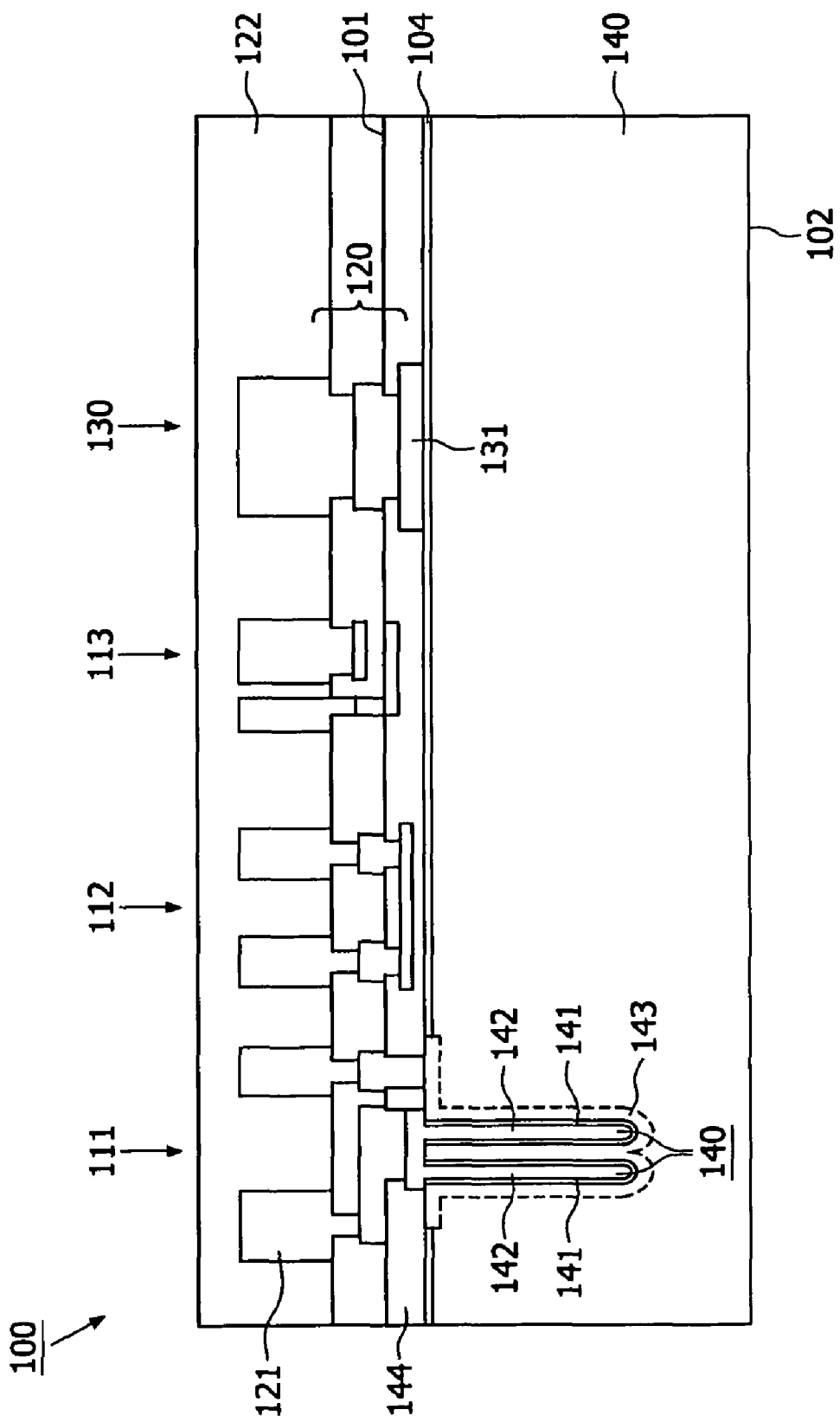
Figure 4:
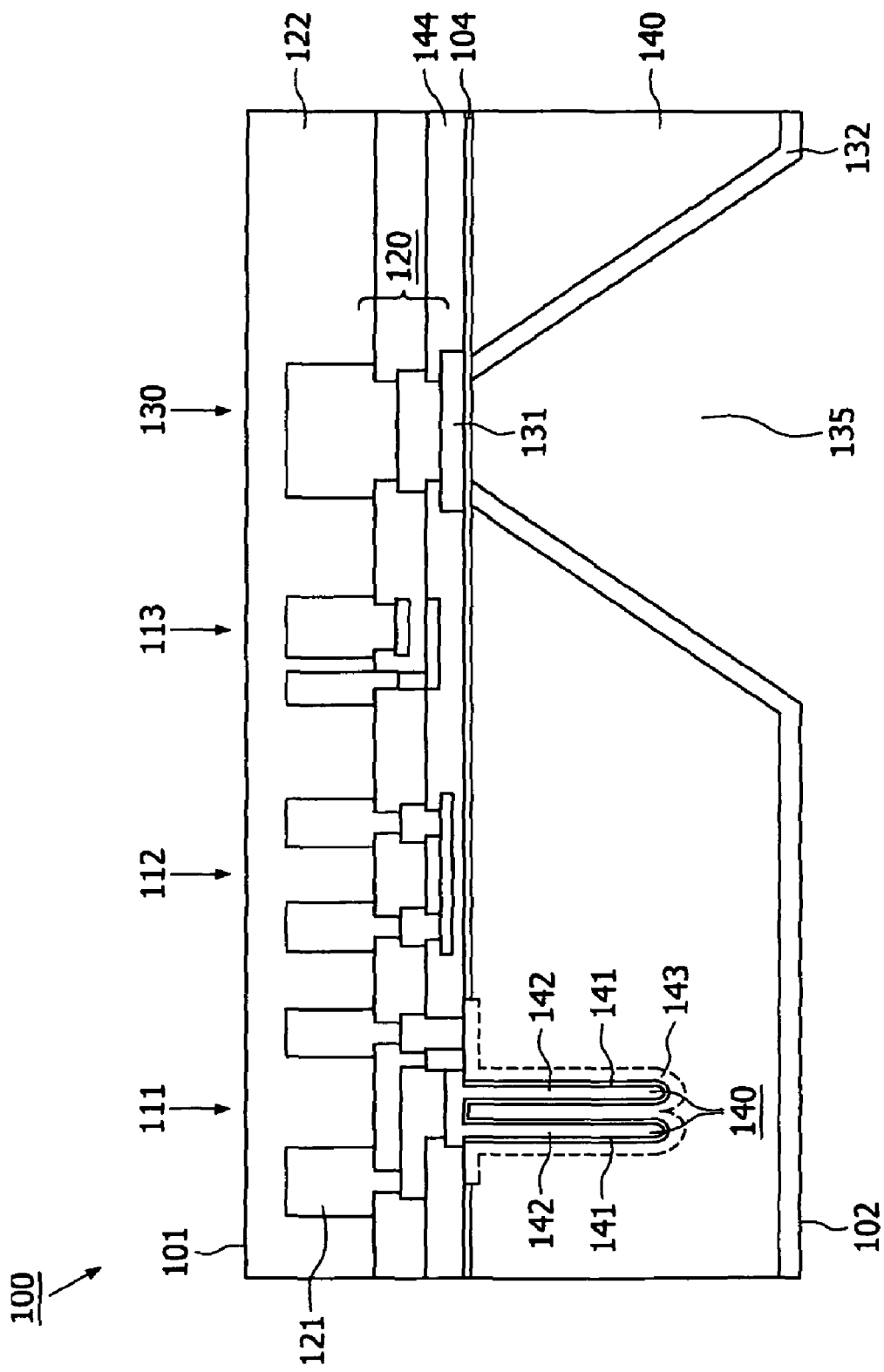

FIGS. 2-4 show the manufacture of the passive IC 100 according to a first embodiment. An insulating layer 104 is defined on the first side 101. Trenches have been etched in the substrate 140 and filled with dielectric material 141 and electrically conductive material 142 to define a capacitor 111. This capacitor 111 has due to its shape a relatively high capacitance density, particularly of 25-100 nF/mm$^2$ or even more. The shape of the trench is open to a design that may be optimised. It could alternatively comprise pillar structures within cavities in the substrate, as has been described in the non-prepublished application PH005852 (EP 06300422.0). The dielectric material suitably comprises a nitride, and most suitably an oxide-nitride-oxide stack. A surface 143 of the trench is doped with electrically conductive particles, in a manner known to the skilled person, in order to function as a capacitor electrode. The conductive material 142 is suitably polysilicon that is doped in known manner. The conductive material 142 is additionally provided at selected areas outside the trench, which is advantageous but not necessary. In this example, some area is used as a resistor 112, while another area is used as a barrier layer 131 that will be part of the vertical interconnect 130 through the interconnection substrate 140. A dielectric material 144 is provided according to a desired pattern, in a manner known to the skilled person, to define contacts to the passive components 111, 112.

FIG. 3 shows the passive IC 100 in a second stage after provision of a metallization structure 120 including electrically conductive and electrically insulating patterns. The metallization structure 120 comprises an additional capacitor 113. This capacitor has a lower capacitance density than the trench capacitor 111, which is often needed in RF applications, while it is defined more precisely, with a better breakdown voltage and with low-ohmic electrodes. The resistor 111 is provided with contacts 111A in a separate layer. The metallization structure 120 has been expanded with a further metal layer 121. This metal layer 121 has a large thickness, i.e. suitably over 1 microns, in order to define inductors that function properly at RF frequencies. Thereto, the thickness must be larger than twice the penetration depth of currents at the frequencies in use. This penetration depth depends on the material of the metal layer 121, which may be a metal such as Al, Cu, Au, an alloy such as Al.Cu, Al.Si, Al.Mg or even doped polysilicon. The metal layer 121 is shown to be covered with a further dielectric layer 122. This further dielectric layer 122 is to be opened or to be removed in order to give access to any bond pads—not shown—in the metal layer 121

FIG. 4 shows a further stage in the manufacture of the passive IC 100. Herein, vertical interconnects 130 are fabricated by wet-chemical etching of through-holes 135 from the second side 102 and subsequent provision of electrically conductive material 132. In the manufacture of the through-holes 135, the etching is brought to an end by an etch stop layer on the front side of the semiconductor substrate 140. This may be a conventional insulating layer 104, such as a nitride or an oxide, but could alternatively be a metal layer.

The electrically conductive material 132 is deposited both on the walls of the etched through-hole 135 and on any exposed metal of the metallization structure 120. Preferably, the through-holes 135 are not filled completely. This prevents that cracks develop in the semiconductor substrate 140 due to differential thermal expansion of the substrate 140 and the metal in the through-hole 135, particularly during thermal cycling or further assembly steps.

This electrically conductive material 132 advantageously comprises a barrier layer, which prevents the formation of undesired alloys between the substrate material (e.g. Si), the exposed metallization structure on top of the vertical interconnect (e.g. Al or Al alloys). It was found in experiments that use of Ti as a barrier layer does not give appropriate results due to reactions between the Al and Si and/or the Ti that are induced by the Ti. Use is made here of a stack of Ni and a further conductive layer, such as silver, aluminum, aluminum alloys, copper, palladium, titanium nitrid or gold. Surprisingly, it has been found that the resulting vertical interconnect has a low impedance and does not suffer from magnetic currents within the Ni layer of the interconnect 130.

In Relation to the Heat Spreader Function of the Substrate

According to a first aspect of the invention, the vertical interconnects 130 through the substrate 140 provide a grounding path for a power amplifier assembled on the front side 101, while the substrate 140 operates as a thermal path. Particularly, it has been found that there is an optimum thickness for the interconnection substrate, at which both a proper grounding and an acceptable thermal dissipation is obtained. This optimum thickness is in the range of 100 to 300 micrometer for the case of a silicon substrate with wet-etched through-holes. If the substrate 140 has a smaller thickness than 100 micrometer, the quality factor of any of the inductors on top of the semiconductor substrate 140 decreases below an appropriate level. Additionally, the overall thermal resistance has been found to increase. If the substrate has a larger thickness than 300 micrometer, then the parasitic inductance of the vertical interconnect 130 increases above an acceptable level and the RF grounding performance will degrade. In the case of dry-etched through-holes, the thickness may be as large as 400 micrometers.

It is observed that this optimum thickness is particularly relevant if the substrate has a lateral width that is larger than the effective distribution of heat within the substrate. This is certainly the case with the platform device of the invention.

Moreover, it was found that the use of the passive IC 100 according to this first aspect of the invention leads to a lower junction temperature of the RF power amplifier 50 device. Such a lower junction temperature additionally leads to an improved operation of the power amplifier device. The linearity of the power amplifier has been found very sensitive for both the operating temperature and a proper electrical grounding. By using the present construction, both are realized. In fact, in the case of an RF power amplifier on a passive IC, the thermal resistance Rth of the assembly is lower than if the amplifier were assembled on the laminate carrier substrate 150 directly. Due to the presence of the passive IC 100 with its semiconductor substrate 140, the heat flows much rapidly 'outside'. Therefore, the junction temperature Tj is lower because Tj is a function of the Rth.

This improved heat spreading is due to the fact that a power amplifier is not a component that is continuously operating at maximum power. Its operation can be considered as a series of power bursts, which particularly occur when making connection with a base station and when amplifying signals. Usually, this leads to a large variation in temperature, caused by heating up and cooling down of the amplifier. Now by using the semiconductor substrate as a heat spreader, the temperature is kept relatively constant. The operation as heat spreader is additionally profitable, as generally, the 'steady state' in which the semiconductor substrate 140 of the passive IC 100 is completely heated up, hardly occurs. For this reason, transfer of heat from the substrate 140 of the passive IC 100 to the laminate carrier substrate 150 is less important). This, evidently, depends also on the communication standard in use and modulation scheme (e.g. GSM, W-CDMA, Bluetooth, etc).

The improved heat spreading does not only contribute to the efficiency of the amplifier, but also prevents that cracks are initiated in the semiconductor substrate due to difference in coefficient of thermal expansion between the substrate and the electrically conducting connections (vias) therein. An additional effect relates to the expansion and contraction of the laminate. The laminate has a Coefficient of Thermal Expansion (CTE) that is different from a semiconductor substrate, which is a known concern in packaging, for instance in Fine pitch Ball Grid Array Packages. It is known that the cooling phase during thermal cycling is most problematic for the stability of the package, in view of the different contraction of laminate as compared to chip. Now, with the invention, there is less cooling, and also less rapid cooling, and the local maximum temperature decreases at the interface of laminate with the semiconductor material. In short, this contributes to reliability in thermal cycling.

The impedance of the vertical interconnect evidently depends on the actual length of the connection. In one embodiment, the interconnect is made by wet-chemical etching from the rear side of the semiconductor substrate and by subsequent metallization of the resulting surface. This wet-etching leads to a cone-shaped through-hole. Any variation in the thickness of the substrate will lead to a deviation of the cross-sectional area of the through-hole—and therewith the interconnect—at the front side of the substrate. It has turned out that particularly the size of this cross-sectional area is relevant for the impedance of the vertical interconnect. When using a substrate thickness in the selected range, and particularly in the preferred range, this deviation of the impedance of the vertical interconnect has negligible impact on the proper functioning of the device.

Suitably, the vertical interconnects do not provide merely a single grounding path to the amplifier, but a plurality of grounding paths. These grounding paths are electrically coupled to different stages in the power amplifier, such as the input and the output and any intermediate stage. The use of a multiple grounding for a RF power amplifier is needed so as to ensure sufficient stability of the amplifier. In RF circuits, an interconnect also has a relevant impedance. Without multiple groundings, a deviation of the ground impedance in one stage (for instance due to the power amplifier operation) would define the ground level in another stage. This introduces uncontrollable artifacts that may disturb an efficient operation of the amplifier. Moreover, such coupled grounding might function as an additional feedback, and the creation of a cycle within the amplifier, in which an amplified current would be fed back to the input of the amplifier. This is undesired, as it may cause breakdown.

Now, according to the invention, it has been found that the impedance of a path from an front side's end of a vertical interconnect to that of a neighboring vertical interconnect is sufficient to make the grounding independent from each other from an RF perspective. This is also the case, when the metallization of the vertical interconnects extends on substantially the complete second side 102 of the vertical interconnection substrate 140, (e.g. the metallization on the second side 102 is unpatterned). This absence of patterning is moreover advantageous, in that the metallization tends to improve the heat transfer from the semiconductor substrate to the adhesive between the passive IC 100 and the carrier substrate 150.

In Relation to the Passive Components

The passive IC 100 comprises different types of inductors and capacitors, and additionally resistors. Each type inductor and capacitor has its own properties, which may be exploited for different functional elements in the RF design of the passive IC:

trench capacitors have a high capacitance density (particularly about 10 $nF/mm^2$, suitably above 20 $nF/mm^2$) with a relative breakdown voltage. These are useful for decoupling applications a planar capacitor, with a top electrode in an intermediate metallization layer. This contributes to a precise definition of the capacitor. Its capacitance density is suitably between 100 and 200 $pF/mm^2$. It is constructed as patented in WO2001061847. This capacitor is highly suitable for RF applications.

an inductor in the bottom metal layer; this inductor has the advantage of a relatively high resolution patterning, enabling the provision of many turns. However, the thickness of the metal layer is relatively limited (for instance in the order of 0.2-0.6 microns), so that the quality factor is limited. This inductor is for instance suitable for RF choke applications an inductor in the top metal layer; this inductor has the advantage of a relatively high quality factor, as the thickness is chosen to be more than twice the penetration depth of currents at relevant high frequencies between 0.8 and 2.5

GHz. This inductor has furthermore the advantage that it may be defined as a portion of an interconnect line. Suitably, such inductor is provided in a U-shape. It is defined in the same layer as the bond pads an inductor in the intermediate metal layer (thickness about 1 micrometer).

Thanks to this plurality of available types of passive elements and the availability of multiple grounding with vertical interconnects extending through the substrate, the passive IC enables the replacement of all discrete elements. This additionally enables a functionality increase without a size increase of the power amplifier module.

The passive IC is particularly a power amplifier device, since a power amplifier uses high powers (for instance more than 3 W), which is much more than many other devices, such as transceivers, displays and the like. Moreover, the impedance matching that is needed for the power amplifier and at the antenna requires a plurality of passive components of substantial dimensions. Furthermore, the passive IC allows the provision of amplifiers and impedance matching for more than one frequency band.

In Relation to the Power Amplifier the power amplifier is particularly designed to be suitable for RF applications, such as frequency bands above 900 MHz up to 3 GHz. This frequency spectrum includes GSM, CDMA, W-LAN, WiMAX, 802.11 and other communication standards. Non-linearities of the signal amplification lead here very rapidly to the provision of noise or a substantial decrease in efficiency.

the power amplifier can be placed in a flip-chip arrangement on the interconnection substrate. This enables a linear connection form ground to Power Amplifier (PA), with minimal losses.

The power amplifier is for instance embodied in a SiGe technology such as for instance Qubic4 as made by Philips Semiconductors. The power supply and ground routing on the power amplifier device can be advantageously lay-outed in order to improve the power and ground performance by a good distribution (for instance, a star connection). The improvement is then on the lay-out side the other improvement is in the via holes themselves: they can be designed so that they improve both the ground inductance and the thermal transfer (by using copper for instance in the via)

One may provide several amplifiers on the passive IC. Such a construction is suitably for multi-band power amplifier modules.

Use of solder balls with a smaller pitch between the power amplifier and the interconnection substrate. This is enabled as there is no difference between the CTEs of both components. The result is miniaturization.

In Relation to the Passive IC

In one embodiment, the passive IC defines a circuit element leading from an input to the power amplifier up to an output to an antenna, with the exception of certain specific functions therein.

The power amplifier usually includes a plurality of stages, in this example three stages. Interstage impedance matching is carried out between the stages of the power amplifier. After the final amplification stage, the signal passes an output match, an antenna switch, a low-pass filter and an impedance matching network. The antenna switch enables switching between the transmit and the receive bands. A further interconnect is present between the antenna switch and an output to a low noise amplifier for amplification of the received signal. The low pass filter and the impedance matching network are in this example integrated into a single functional block. If the passive IC is suitable for the processing of signals in more than one frequency band, a band switch is provided additionally. Particularly, such band switch is present between the power amplifiers and the antenna switch.

The interstage impedance matching comprises an LC-network, wherein the capacitors are connected in the signal line, while the inductor is coupled between the signal line and ground. In a suitable example, such LC-network comprises three inductors and two capacitors.

In the present assembly, capacitors and inductors may be defined in the power amplifier device, on the passive IC and in the carrier substrate. In a suitable embodiment, at least one of the inductors of the interstage matching is provided on the passive IC. This appears advantageous so as to minimize the size of the power amplifier device. In the embodiment that the power amplifier is assembled to the passive IC in a flip-chip orientation, e.g. with solder bumps, the inductor is suitably defined in an area facing the power amplifier device. This is allowed, as the inductor operates as an RF choke, for which the quality factor is not highly relevant. In order to minimize noise, the power amplifier device is designed so as that an area overlapping with said inductors is kept free of sensitive components, The capacitors of the interstage matching are however provided in the power amplifier device. As the power amplifier device is defined with a higher resolution than the passive IC, the capacitor in the amplifier device may be provided with a relatively high capacitance density. Moreover, integration of the capacitor in the power amplifier reduces the length of the interconnects to the capacitor, and therewith any parasitic inductance.

The situation is different for the output matching. The impedance in the power amplifier is rather low, particularly only a couple of ohms, while the standard impedance level in RF applications is defined as 50Ω. The output match here enables the transformation. Due to the size requirements, the transformation is preferably carried out in the carrier substrate. This additionally allows the use of inductors with coupled windings on top of each other. Thereto, the interconnect on the passive IC from the output of the amplifier to the output match is defined as a very low-ohmic interconnect. Thereto, the connection of the amplifier to the passive IC is made with a plurality of solder bumps. The interconnect is given sufficient width, while a grounded metal face on the rear side of the passive IC provides the interconnect with a stripline character. The connection to the carrier substrate is enabled with bond wires.

For the low pass filter, one requires to have low losses and to prevent any parasitic coupling through the substrate. Additionally, the specified tolerances are low. It has turned out, that the parasitic coupling occurs primarily in a direction normal to the substrate. This coupling is caused by a magnetic field, while an electrostatic field is at least substantially absent. The sources for such parasitic coupling are any bond wires between carrier substrate and passive IC, as well as vertical interconnects through the substrate. In order to improve the low pass filter, the inductor is defined in the passive IC, while any bond wires are absent between the antenna switch and the output to the antenna.

While this example shows the provision of inductors in the carrier substrate 150, the inductors may be defined in a separate device so as to reduce the complexity of the carrier substrate 150. In that case, a leadframe could be used instead of a laminate as the carrier substrate 150. The separate device is for instance a metal layer that is integrated in an encapsulating mould, as is known per se from WO-A 2003/85729.

Suitably, the passive IC enables the processing of signals from at least two separate frequency bands. In this case, the power amplifier device and a power control device may be designed so as to operate for both frequencies. Particularly, the power amplifier device then comprises a first section for the first band and a second section for the second band, which sections are independent and free of any mutual connection. Interconnects for power control signals are suitably defined in an area on the passive IC between both sections. An isolation area is defined in the power amplifier device between the sections for the different frequency bands. The power control interconnects on the passive IC may then extend below this isolation area.

In Relation to the ESD Protection of the Passives

In order to protect the passive IC against electrostatic discharge pulses that may occur during assembly, it comprises a specific protection. Particularly small capacitors in the passive IC are highly sensitive to ESD pulses. Such capacitors may be implemented as planar capacitors, but alternatively as trench capacitors in the substrate. Integration of diodes or other active elements in the passive IC is difficult. Crosstalk between individual active elements readily occurs due to the high resistivity of the substrate, unless specific shielding of the elements is implemented.

According to this aspect of the invention, the capacitor is ESD-protected through a resistor between the capacitor output and a ground connection within the passive IC, which resistor has a resistance value that is sufficiently high so as to prevent any substantial influence on the RF grounding. Due to the choice of the resistor, there is no DC voltage over the resistor during use of the passive IC. If needed, an additional capacitor can be connected in series with the resistance. The term 'capacitor output' is used herein to define the output that is connected to ground after finalization of the assembly.

Figure 5:
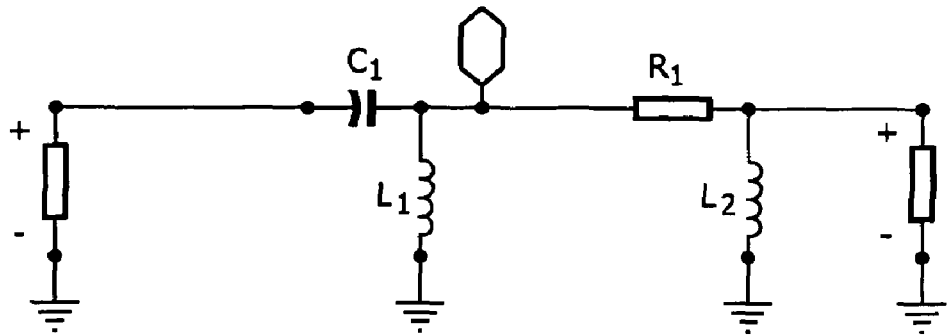
FIG. 5 shows an equivalent circuit of decoupling plus ESD protection resistance after wirebonding.

FIG. 5 shows an equivalent circuit of the passive IC with the ESD protection according to the invention, in the situation after assembly. The capacitor C1 is a capacitor with a relatively low breakdown voltage that is sensible for ESD pulses that occur during assembly—which are generally lower than those occur during use of the device. The capacitor C1 is in this case a planar metal-insulator-metal capacitor with a capacity of 30 pF and a resistance of 1Ω. It is coupled on its input to an internal circuit, which is in itself provided with a ground connection with a standard impedance of 50Ω. The capacitor output is coupled to an external ground EG through a bond wire. This bond wire has a typical resistance of 0.1Ω, and an inductance of 1.0 nH, as calculated at a frequency of 2 GHz. The capacitor output is herein further coupled to a bond pad 95, to which a further component may be assembled. In the invention, an ESD protection is provided with a suitable resistor, that provides a connection to an internal ground over a parasitic inductance of merely 0.2 nH. This is suitably enabled with a vertical interconnect through the substrate. It is also coupled from further internal ground IG, with an impedance of 50Ω.

Figure 6:
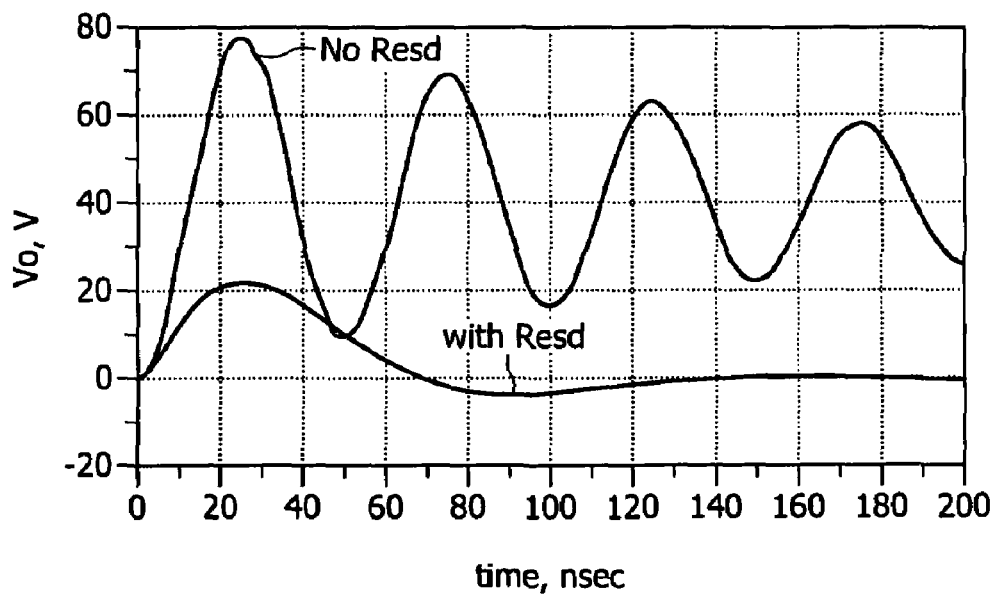
FIGS. 6 and 7 show the reduction of peak voltage as a function of time elapsed after an ESD event for a circuit with and without the ESD-resistor, as measured according to two different ESD-models.
Figure 7:
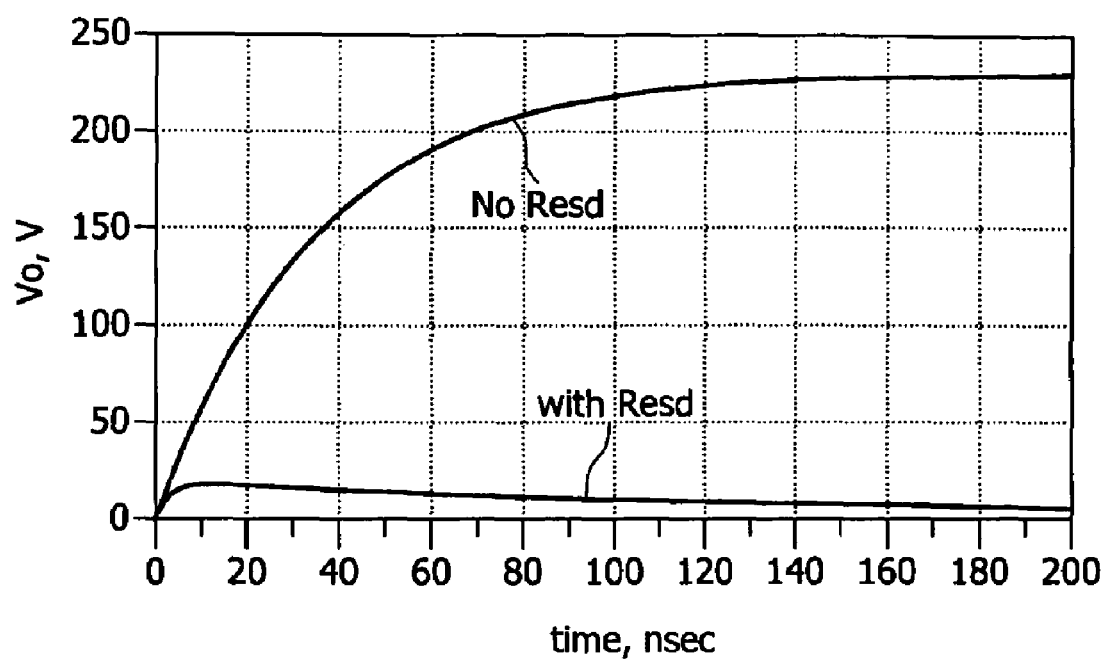

FIGS. 6 and 7 show the resulting reduction of the ESD peak voltage according to two models—a 50 V peak in the Machine Model (FIG. 6), and a 300 V peak in the Human Body Model (FIG. 7). The reduction of the ESD peak is substantial. The reduction of peak voltage is fourfold for a 50V ESD pulse—from 80 to 20 V—, as given in accordance with the Machine Model. The reduction of peak voltage is even much more for a 300 V ESD pulse, as given in accordance with the Human Body Model. Without resistor, peak voltages above 200V were found. The peak voltage remained in a time frame of far more than 200 ns. With the resistor, the peak voltage was less than 20 V, and dissipation started already after 10 ns.

It has been found that this coupling between an internal ground and an external ground has marginal influence on the RF behavior of the passive IC. The ground impedance is slightly higher at 900 MHz (1.5 vs 1.1. ohm impedance value). The coupling between internal and external ground increases with the frequency, and is at 1 GHz about −50 dB and at 3.0 GHz less than −30 dB. These are acceptable levels of coupling.

Suitably, the resistance value of the ESD protection is at least ten times as large as the impedance of the connection from the bond pad to external ground. In the case of a bond wire, such connection impedance is for instance 6 CI at a frequency of about 2 GHz. The resistance value is then suitably larger than 60Ω, for instance up to 200Ω.

The ESD resistor should be designed to allow the flow of a peak current following an ESD pulse through it. In case that the ESD resistor is aimed at the prevention of damage of an ESD event during assembly or prior to assembly, the voltages of an ESD pulse and the following current are relatively low, and a resistor in doped polysilicon is adequate, while a resistor of TiWN is one of the available alternatives. If one desires to improve an ESD-protection level from 2 kV to 4 kV, the resistor should be designed for a peak current of 3 A.

This ESD protection is particularly suitable for passive ICs as discussed in the present application. In such passive ICs for RF power applications, the input stage cannot be decoupled and grounded via the normal ground, as this would introduce too much coupling between input and output, which leads to instabilities. It is however not limited thereto, and may be used with benefits for any device comprising ESD-sensitive devices, such as in particular trench capacitors.

The invention claimed is:

1. An integrated circuit arrangement comprising:
    an integrated circuit located on the integrated circuit carrier including
        a substrate;
        an internal ground located below the substrate;
        a capacitor located above bottom surface of the substrate and having an output node and an input node; and
        a resistive element providing electrostatic discharge (ESD) protection for the capacitor by providing a first current path from the output node of the capacitor to the internal ground; and
    an impedance element providing a second current path from the output node of the capacitor to the external ground, wherein the ratio of resistances between the first current path and the second current path is sufficient to substantially decouple the external ground from the internal ground at circuit-operating frequencies up to 900 MHz.

2. The integrated circuit arrangement of claim 1, wherein the substrate has a resistivity and thickness tuned for the use of high quality inductors thereon.

3. The integrated circuit arrangement of claim 1, wherein the substrate has a thickness of between 100 and 300 micrometers and a resistance of at least 0.5 kΩcm.

4. The integrated circuit arrangement of claim 1, wherein the resistive element is connected to internal ground through a vertical interconnection within the substrate.

5. The integrated circuit arrangement of claim 1, wherein the resistive element and the first current path are configured and arranged to provide ESD protection for the capacitor in the absence of the impedance element and the second current path and to decouple the internal ground.

6. The integrated circuit arrangement of claim 1, further including
    an integrated circuit carrier having
        a carrier substrate;
        at least one bond pad located on top of the substrate;

an inductor located within the carrier substrate and electrically connected to the at least one bond pad;

terminals located on a bottom of the carrier substrate; and thermal vertical interconnections through the carrier substrate connected to one or more of the terminals;

an adhesive layer side bonded to the carrier substrate and to the substrate of the integrated circuit; and a bond wire connecting the at least one bond pad to the integrated circuit, thereby providing the second current path.

* * * * *